(12) United States Patent
May et al.

(10) Patent No.: US 10,472,742 B1
(45) Date of Patent: Nov. 12, 2019

(54) FABRIC-BASED ITEMS WITH FUSIBLE INSULATING STRANDS

(71) Applicant: Apple Inc., Cupertino, CA (US)

(72) Inventors: Maurice P. May, Sunnyvale, CA (US); Kiran K. Malladi, Palo Alto, CA (US); Daniel A. Podhajny, San Jose, CA (US); Daniel D. Sunshine, Sunnyvale, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 15/424,607

(22) Filed: Feb. 3, 2017

Related U.S. Application Data

(60) Provisional application No. 62/296,293, filed on Feb. 17, 2016.

(51) Int. Cl.

| | | |
|---|---|---|
| *H01B 3/48* | (2006.01) | |
| *H01B 7/08* | (2006.01) | |
| *D02G 3/38* | (2006.01) | |
| *H05K 1/18* | (2006.01) | |
| *H05K 1/03* | (2006.01) | |
| *H05K 3/34* | (2006.01) | |
| *H05K 1/11* | (2006.01) | |

(52) U.S. Cl.
CPC ............. *D02G 3/38* (2013.01); *H05K 1/038* (2013.01); *H05K 1/111* (2013.01); *H05K 1/189* (2013.01); *H05K 3/34* (2013.01); *D10B 2401/16* (2013.01); *D10B 2501/00* (2013.01); *H05K 2201/0129* (2013.01); *H05K 2201/10378* (2013.01); *H05K 2201/10984* (2013.01)

(58) Field of Classification Search
CPC .......... H01B 3/48; H01B 3/082; H01B 11/18; H01B 7/08
USPC ................ 174/28, 121 R, 111, 126.4, 117 M
See application file for complete search history.

(56) References Cited

U.S. PATENT DOCUMENTS

| 452,340 | A | * | 5/1891 | Conner | .................. | H01B 7/285 |
|---|---|---|---|---|---|---|
| | | | | | | 174/23 R |
| 2,734,934 | A | * | 2/1956 | McKnight | .............. | H01B 3/082 |
| | | | | | | 156/56 |

(Continued)

FOREIGN PATENT DOCUMENTS

DE          1085207       *   7/1960

*Primary Examiner* — Chau N Nguyen
(74) *Attorney, Agent, or Firm* — Treyz Law Group, P.C.; Kendall W. Abbasi

(57) ABSTRACT

An item may include fabric or other materials formed from intertwined strands of material. The item may include circuitry that produces signals. The strands of material may include non-conductive strands and conductive strands. The conductive strands may carry the signals produced by the circuitry. Conductive strands may be insulated by insulating strands that have been wrapped around the conductive strands. Insulating strands may include strands of fusible material that softens when heated to the appropriate temperature. Fusible insulating strands may be interspersed with insulating strands of a different material. The fusible insulating strands may be heated such that the fusible material melts and fills gaps between the other insulating strands, thereby forming a watertight covering over the conductive strand. The fusible insulating strands may be used to insulate electrical connections between conductive strands and/or between electronic components and conductive strands.

19 Claims, 12 Drawing Sheets

(56) References Cited

U.S. PATENT DOCUMENTS

| | | | | |
|---|---|---|---|---|
| 2,863,032 | A | * | 12/1958 | Morris .................. H01B 7/292 174/102 R |
| 4,332,976 | A | * | 6/1982 | Hawkins ............ H01B 11/1834 174/102 R |
| 4,430,384 | A | * | 2/1984 | George .................. C04B 26/06 174/121 A |
| 4,810,834 | A | * | 3/1989 | Grogl ..................... H01B 7/183 174/121 R |
| 5,286,923 | A | * | 2/1994 | Prudhon ............. H01B 7/0233 174/107 |
| 5,475,203 | A | * | 12/1995 | McGaffigan .......... B29C 65/344 219/545 |
| 5,572,860 | A | | 11/1996 | Mitsumoto et al. |
| 6,674,008 | B2 | * | 1/2004 | Nakamura ........ H01L 23/49822 174/117 M |
| 6,965,081 | B2 | * | 11/2005 | Eves .................... H01B 7/0009 174/105 R |
| 2004/0244193 | A1 | * | 12/2004 | Jung ...................... H05K 3/363 29/854 |
| 2007/0190881 | A1 | * | 8/2007 | Shibaoka ............ D03D 1/0088 442/228 |
| 2009/0068908 | A1 | | 3/2009 | Hinchcliff |
| 2010/0065320 | A1 | * | 3/2010 | Urano ................. D03D 1/0082 174/261 |
| 2012/0073859 | A1 | * | 3/2012 | Lo ........................... H01L 24/43 174/126.4 |
| 2014/0262478 | A1 | * | 9/2014 | Harris .................... H05K 9/009 174/393 |

\* cited by examiner

FABRIC-BASED ITEMS WITH FUSIBLE INSULATING STRANDS

This application claims the benefit of provisional patent application No. 62/296,293, filed Feb. 17, 2016, which is hereby incorporated by reference herein in its entirety.

FIELD

This relates generally to fabric-based items and, more particularly, to fabric-based items with electrical components.

BACKGROUND

It may be desirable to form items such a bags, clothing, and other items from intertwined strands of material. For example, woven or knitted fabric or braided strands may be used in forming portions of an item.

In some situations, it may be desirable for some or all of a strand of material in an item to be conductive. Conductive strands may be used, for example, to carry signals between circuitry in different portions of an item. Strands such as conductive strands may serve mechanical functions (e.g., by forming a part of a fabric) and/or electrical functions (e.g., by conveying signals).

Challenges may arise when forming items such as fabric-based items with conductive strands. It is often desirable for conductive strands to exhibit good mechanical properties, such as high strength and flexibility. Because conductive strands may need to carry electrical signals, the resistance of a conductive strand should generally not be too high. Conductive strands should also be compatible with the non-conductive strands in a fabric and should not form undesired short circuits with surrounding structures. If care is not taken, conductive strands in a fabric-based item may be overly fragile, may exhibit poor signal carrying capabilities, may be insufficiently isolated from surrounding structures, or may adversely affect the appearance and feel of the item.

SUMMARY

An item may include fabric or other materials formed from intertwined strands of material. The item may include circuitry that produces signals. The strands of material may include non-conductive strands and conductive strands. Strands may be intertwined using weaving equipment, knitting equipment, braiding equipment, or other equipment for intertwining strands of material. If desired, the non-conductive strands and conductive strands may be close in size (e.g., to minimize or eliminate perceptible differences in the appearance and feel of the non-conductive and conductive strands).

The conductive strands may carry the signals produced by the circuitry. Each conductive strand may have a conductive core that carries electrical signals. The conductive core may be a solid conductive core or may be formed from a non-conductive inner core that has been covered with a conductive coating. In arrangements where the conductive core is formed from a non-conductive inner core that has been covered with a conductive material, the non-conductive inner core may be formed from polymers such as para-aramids and aromatic polyesters (as examples). The conductive coating may be formed from a metal such as silver or other metals.

To mechanically and electrically insulate and isolate conductive strands, insulating material may surround the conductive core of the conductive strands. Examples of materials that may be used for forming the insulator include polyvinyl formal, polyester-polyimide, polyamide-polyimide, polyamide, polyimide, polyester, polytetrafluoroethylene, polyurethane, and other polymers. In some arrangements, the insulating material may be a relatively thin insulator coating such as an insulator coating with a thickness of less than 5 microns or other suitable thickness. In some arrangements, the insulating material may be formed from non-conductive strands that have been wrapped around the conductive core to electrically insulate the conductive core and protect the conductive core from moisture and other contaminants. Fabric-based items that include a combination of insulating coatings and insulating strands may also be used.

Inner polymer strand cores may be formed by extrusion, spinning, or other techniques. Metal coatings for the inner strand cores may be formed by electrochemical deposition or other metal deposition techniques.

Insulating strands may include strands of fusible material that softens when heated to the appropriate temperature. Fusible insulating strands may be interspersed with insulating strands of a different material. The fusible insulating strands may be heated such that the fusible material melts and fills gaps between the other insulating strands, thereby forming a watertight covering over the conductive strand. The fusible insulating strands may be used to insulate electrical connections between conductive strands and/or between electronic components and conductive strands.

DETAILED DESCRIPTION

Figure 1:
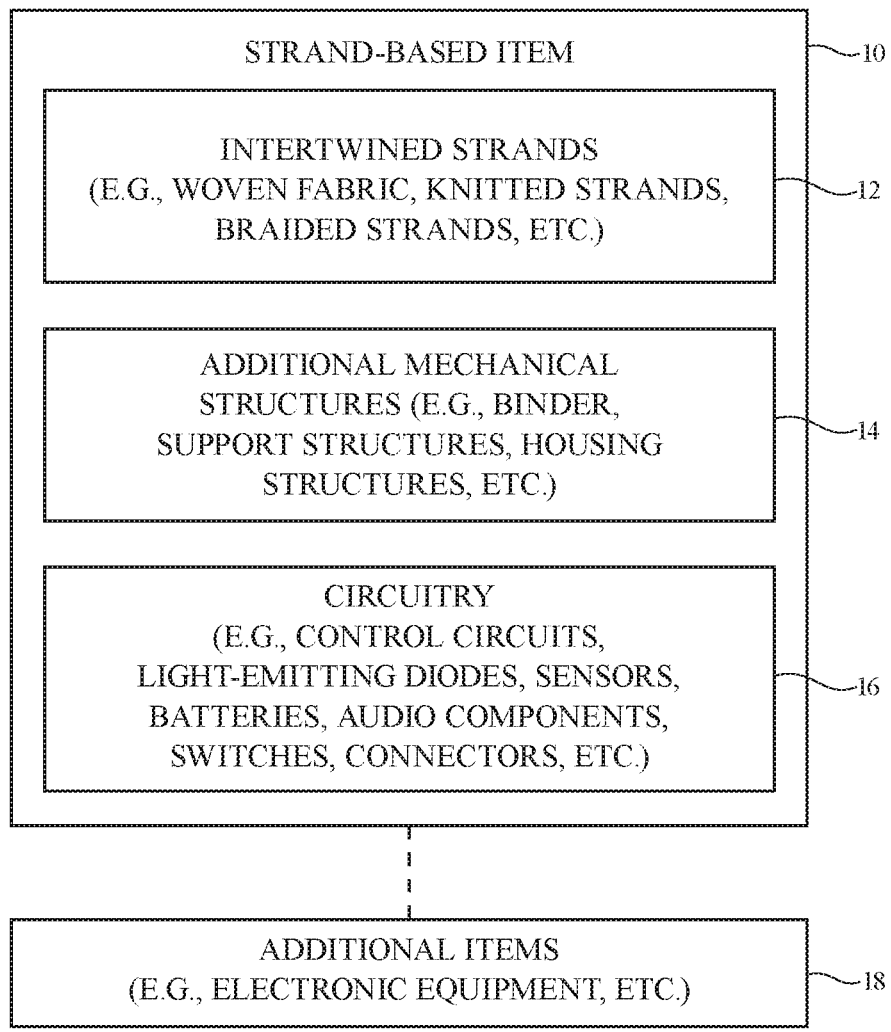
FIG. 1 is a schematic diagram of an illustrative item that may include strands of material in accordance with an embodiment.

Strands of material may be incorporated into strand-based items such as strand-based item 10 of FIG. 1. Item 10 may be an electronic device or an accessory for an electronic device such as a laptop computer, a computer monitor containing an embedded computer, a tablet computer, a cellular telephone, a media player, or other handheld or portable electronic device, a smaller device such as a wristwatch device, a pendant device, a headphone or earpiece device, a device embedded in eyeglasses or other equipment worn on a user's head, or other wearable or miniature device, a television, a computer display that does not contain an embedded computer, a gaming device, a navigation device, an embedded system such as a system in which fabric-based item 10 is mounted in a kiosk, in an automobile, airplane, or other vehicle, other electronic equipment, or equipment that implements the functionality of two or more of these devices. If desired, item 10 may be a removable external case for electronic equipment, may be a strap, may be a wrist band or head band, may be a removable cover for a device, may be a case or bag that has straps or that has other structures to receive and carry electronic equipment and other items, may be a necklace or arm band, may be a wallet, sleeve, pocket, or other structure into which electronic equipment or other items may be inserted, may be part of a chair, sofa, or other seating (e.g., cushions or other seating structures), may be part of an item of clothing or other wearable item (e.g., a hat, belt, wrist band, headband, etc.), or may be any other suitable strand-based item.

Strands in strand-based item 10 may form all or part of a housing wall for an electronic device, may form internal structures in an electronic device, or may form other strand-based structures. Strand-based item 10 may be soft (e.g., item 10 may have a fabric surface that yields to a light touch), may have a rigid feel (e.g., the surface of item 10 may be formed from a stiff fabric), may be coarse, may be smooth, may have ribs or other patterned textures, and/or may be formed as part of a device that has portions formed from non-fabric structures of plastic, metal, glass, crystalline materials, ceramics, or other materials.

Item 10 may include intertwined strands 12. The strands may be intertwined using strand intertwining equipment such as weaving equipment, knitting equipment, braiding equipment, or equipment that intertwines strands by entangling the strands with each other in other ways (e.g., to form felt). Intertwined strands 12 may, for example, form woven or knitted fabric or other fabric (i.e., item 10 may be a fabric-based item), a braided cord, etc.

Strands 12 may be single-filament strands or may be threads, yarns, or other strands that have been formed by intertwining multiple filaments of material together. Strands 12 may be formed from polymer, metal, glass, graphite, ceramic, natural fibers such as cotton, bamboo, wool, or other organic and/or inorganic materials and combinations of these materials. Strands 12 may be insulating or conductive.

Conductive coatings such as metal coatings may be formed on non-conductive strands (e.g., plastic cores) to make them conductive and strands such as these may be coated with insulation or left bare. Reflective coatings such as metal coatings may be applied to strands 12 to make them reflective. Strands 12 may also be formed from single-filament metal wire, multifilament wire, or combinations of different materials.

Strands 12 may be conductive along their entire length or may have conductive segments (e.g., metal portions that are exposed by locally removing insulation or that are formed by adding a conductive layer to a portion of a non-conductive strand.). Threads and other multifilament yarns that have been formed from intertwined filaments may contain mixtures of conductive fibers and insulating fibers (e.g., metal strands or metal coated strands with or without exterior insulating layers may be used in combination with solid plastic fibers or natural fibers that are insulating).

Item 10 may include additional mechanical structures 14 such as polymer binder to hold strands 12 together, support structures such as frame members, housing structures (e.g., an electronic device housing), and other mechanical structures.

Circuitry 16 may be included in item 10. Circuitry 16 may include components that are coupled to strands 12, components that are housed within an enclosure formed by strands 12, components that are attached to strands 12 using welds, solder joints, adhesive bonds (e.g., conductive adhesive bonds), crimped connections, or other electrical and/or mechanical bonds. Circuitry 16 may include metal structures for carrying current, integrated circuits, discrete electrical components such as resistors, capacitors, and inductors, switches, connectors, light-emitting components such as light-emitting diodes, audio components such as microphones and speakers, vibrators, solenoids, piezoelectric devices, and other electromechanical devices, connectors, microelectromechanical systems (MEMs) devices, pressure sensors, light detectors, proximity sensors, force sensors, moisture sensors, temperature sensors, accelerometers, gyroscopes, compasses, magnetic sensors, touch sensors, and other sensors, components that form displays, touch sensors arrays (e.g., arrays of capacitive touch sensor electrodes to form a touch sensor that detects touch events in two dimensions), and other input-output devices. Circuitry 16 may also include control circuitry such as non-volatile and volatile memory, microprocessors, application-specific integrated circuits, system-on-chip devices, baseband processors, wired and wireless communications circuitry, and other integrated circuits.

Item 10 may interact with electronic equipment or other additional items 18. Items 18 may be attached to item 10 or item 10 and item 18 may be separate items that are configured to operate with each other (e.g., when one item is a case and the other is a device that fits within the case, etc.). Circuitry 16 may include antennas and other structures for supporting wireless communications with item 18. Item 18 may also interact with strand-based item 10 using a wired communications link or other connection that allows information to be exchanged.

In some situations, item 18 may be an electronic device such as a cellular telephone, computer, or other portable electronic device and strand-based item 10 may form a case or other structure that receives the electronic device in a pocket, an interior cavity, or other portion of item 10. In other situations, item 18 may be a wrist-watch device or other electronic device and item 10 may be a strap or other strand-based item that is attached to item 18. In still other situations, item 10 may be an electronic device, strands 12 may be used in forming the electronic device, and additional items 18 may include accessories or other devices that interact with item 10.

If desired, magnets and other structures in items 10 and/or 18 may allow items 10 and 18 to interact wirelessly. One item may, for example, include a magnet that produces a magnetic field and the other item may include a magnetic switch or magnetic sensor that responds in the presence of the magnetic field. Items 10 and 18 may also interact with themselves or each other using pressure-sensitive switches, pressure sensors, force sensors, proximity sensors, light-based sensors, interlocking electrical connectors, etc.

The strands that make up item 10 may be intertwined using any suitable strand intertwining equipment. For example, strands 12 may be woven together to form a fabric. The fabric may have a plain weave, a satin weave, a twill weave, or variations of these weaves, may be a three-dimensional woven fabric, or may be other suitable woven fabric. If desired, the strands that make up item 10 may be intertwined using knitting equipment, braiding equipment, or other strand intertwining equipment. Item 10 may also incorporate more than one type of fabric or intertwined strand-based material (e.g., item 10 may include both woven and knitted portions).

Figure 2:
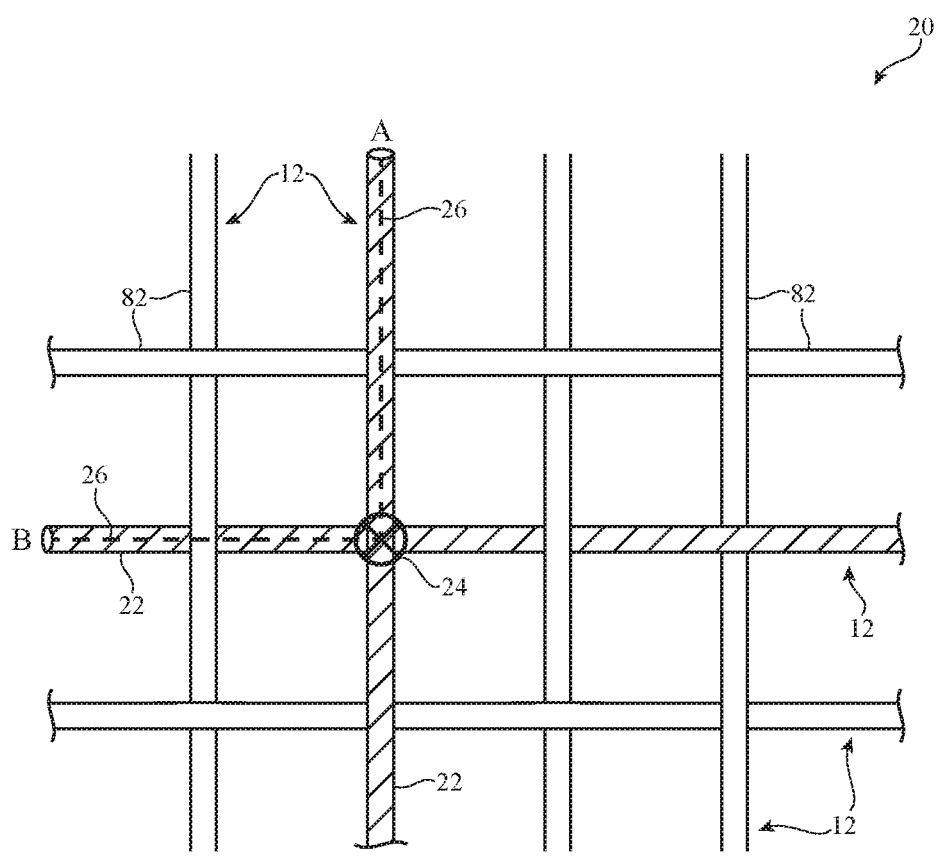
FIG. 2 is a diagram of a portion of a fabric with conductive strands in accordance with an embodiment.

The strands that make up item 10 may be intertwined to form a fabric such as illustrative fabric 20 of FIG. 2. Fabric 20 may include strands 12. Strands 12 may be formed from conductive and/or insulating materials. As an example, fabric may be formed from insulating strands 82 interspersed with conductive strands 22. In the illustrative configuration of FIG. 2, a first conductive strand 22 extends vertically and electrically connects node A with junction 24 and a second conductive strand 22 extends horizontally (i.e., perpendicular to the first conductive strand) and electrically connects node B with junction 24. At the intersection of the first and second conductive strands at junction 24, the first and second strands may be electrically connected using mechanical contact, solder, welds, conductive adhesive, a crimped metal connection or other metal connector, or other electrical connection structure. Using this type of technique, desired signal paths such as illustrative signal path 26 between nodes A and B may be formed within fabric 20 (e.g., to form signal busses, to form electrodes or other parts of sensors, to form other conductive structures, etc.).

In addition to forming electrical connections between conductive strands 22, electrical connections may be formed between electronic components and conductive strands 22. For example, an electronic component may be electrically and mechanically connected to one or more strands 22 using mechanical contact, solder, welds, conductive adhesive, a crimped metal connection or other metal connector, or other electrical connection structures.

Conductive strands such as conductive strands 22 in illustrative fabric 20 for item 10 may be formed from one or more layered materials. For example, conductive strand 22 may have an inner core (e.g., an elongated member such as a monofilament), one or more coatings (e.g., insulating or conductive coatings) on the inner core, and/or one or more outer layers formed from additional strands that have been wrapped (e.g., twisted or braided) around the core.

The different portions of the conductive strand may be formed from different materials or, if desired, two or more of the portions of the conductive strand may be formed from the same material. As an example, a conductive strand may have a core and an outer coating that are formed from a common dielectric and that are separated by an intermediate layer formed from a conductive material. Configurations may also be used in which a conductive strand has a core formed from a first dielectric and an outer layer formed from a second dielectric and in which the first and second dielectrics are separated from each other by an intervening conductive layer such as a metal layer.

In some configurations, conductive strand 22 may contain polymer. For example, conductive strand 22 may contain a polymer core to provide strand 22 with strength and flexibility. Polymer may also be used in forming insulating outer coating layers. Examples of polymers that may be used in forming a core and/or an outer insulating coating for conductive strand 22 include polyamide (nylon—e.g., nylon6, nylon6,6, nylon 11), aromatic polyamide (i.e., para-aramids such as Kevlar® or other aramids), polyimide, polyester, polyolefin, acrylic, aromatic polyesters such as Vectran®, polyethylene, extruded cellulosic polymers such as rayon and Tencel®, polyvinyl formal, polyester-polyimide, polyamide-polyimide, polytetrafluoroethylene, and polyurethane. Other polymers or mixtures of these polymers may be used, if desired. Inorganic materials may also be used in forming dielectric strand cores and insulating layers. Illustrative configurations in which these strand structures are formed from polymers are sometimes described herein as an example.

The polymer materials of strand 22 may be formed from conductive organic material, from insulating polymeric materials (e.g., materials to form a dielectric core and/or outer coating), from polymer that includes conductive filler such as particles of metal, particles of carbon nanotube material, graphene particles, fibrous carbon material, or other conductive particles. Conductive filler may be incorporated into the polymer in a concentration that renders a portion of strand 22 conductive or may be incorporated into the polymer in a lower concentration (e.g., to promote adhesion or otherwise enhance compatibility with other portions of strand 22 without necessarily increasing the conductivity of the polymer to a level that allows the material to serve as a conductive signal path in fabric 20).

In some situations, monofilaments may be formed of metal or polymer (i.e., polymer with conductive filler or without conductive filler). These monofilaments may be intertwined to form strands 22 or portions of strands 22. In general, strands 22 may have one or more materials, two or more materials, three or more materials, four or more materials, or five or more materials. The structures of strands 22 may incorporate conductive materials such as metal, insulating materials such as polymer, conductive organic materials such as conductive polymer, polymer filled with metal particles and other conductive filler, other materials, and/or combinations of these materials.

Illustrative examples of conductive strands that may be used in fabric-based item 10 are shown in FIGS. 3, 4, 5, and 6.

Figure 3:
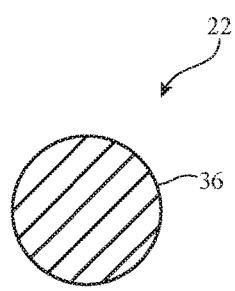
FIG. 3 is a cross-sectional side view of an illustrative conductive strand formed from solid conductive core in accordance with an embodiment.

In the example of FIG. 3, conductive strand 22 is formed from a solid core of conductive material 36. Conductive material 36 may be formed from metal or other conductive material. Examples of metals that may be used in forming conductive material 36 include gold, silver, copper, aluminum, nickel, palladium, molybdenum, platinum, titanium, and tungsten. Other metals may also be used for material 36 of strand 22.

Figure 4:
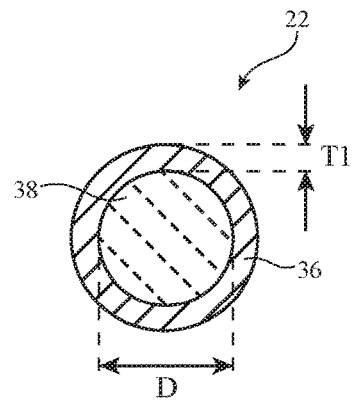
FIG. 4 is a cross-sectional side view of an illustrative conductive strand formed from a non-conductive inner core surrounded by a conductive coating in accordance with an embodiment.

In the example of FIG. 4, conductive strand 22 is formed from an inner core of non-conductive material 38 and an outer coating of conductive material 36. Conductive material 38 may be a conductive inner core having a circular cross-sectional shape or other suitable cross-sectional shape. Non-conductive inner core 38 may be formed from para-aramid fiber (e.g., Kevlar®), spun aromatic polyester fiber (e.g., Vectran®), or other polymer fiber. Core 38 is preferably thermally stable (e.g., core 38 is preferably able to withstand exposure to elevated temperatures without incurring damage). The elevated temperatures may be, for example, temperatures of 200-300° C., more than 150° C., more than 250° C., more than 350° C., less than 250° C., 210-220° C., or other suitable temperatures. Core 38 also preferably has a high elastic modulus (Young's modulus), such as a modulus of 50-250 GPa, 50-150 GPa, 100-200 GPa, more than 50 GPa, less than 250 GPa, etc. If desired, core 38 may have other advantageous physical attributes such as being insensitive to degradation due to exposure to light, having a good abrasion resistance, being highly flexible, exhibiting a high strength-to-weight ratio, forming a good electrical insulator, etc.

To form fabrics and other intertwined strands with desired properties, it may be desirable for the diameter of core 38 to be relatively small. As an example, diameter D of core 38 may be 50-70 microns, 25-100 microns, less than 100 microns, less than 150 microns, more than 10 microns, 10-200 microns, 10-500 microns, 150-250 microns, more than 50 microns, less than 400 microns, or other suitable diameter. The linear mass density of core 38 may be 220 denier, 130 denier, 55 denier, 28 denier, less than 100 denier, less than 75 denier, 75-20 denier, 75-25 denier, less than 60 denier, 60-25 denier, more than 10 denier, more than 20 denier, or other suitable linear mass density.

The thickness TI of conductive coating 36 may be 25 microns, more than 1 micron, more than 5 microns, less than 25 microns, less than 10 microns, less than 100 microns, 10-50 microns, 20-70 microns, more than 15 microns, more than 20 microns, less than 35 microns, less than 50 microns, less than 5 microns, or other suitable thickness. Coating 36 may be a metal (e.g., an elemental metal such as silver and/or a metal alloy) that has been deposited by electrochemical deposition, physical vapor deposition, etc. or may be any other suitable conductive layer.

Figure 5:
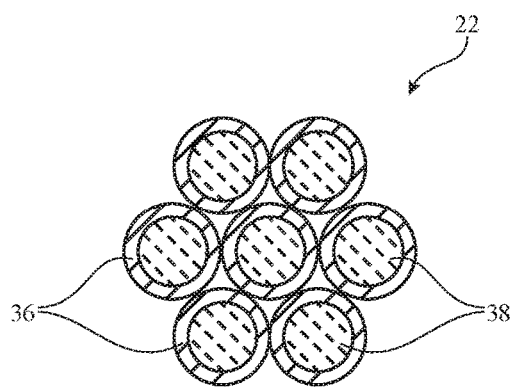
FIG. 5 is a cross-sectional side view of an illustrative conductive strand formed from a bundle of non-conductive inner cores that are each surrounded by a conductive coating in accordance with an embodiment.
Figure 6:
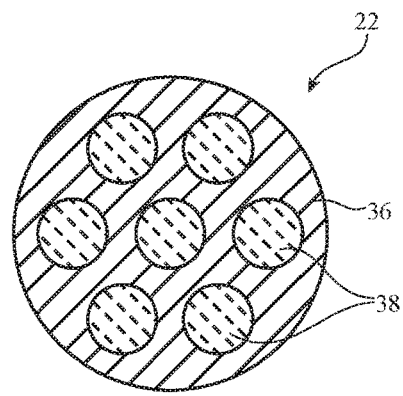
FIG. 6 is a cross-sectional side view of an illustrative conductive strand formed from a bundle of non-conductive inner cores that have all been surrounded by a conductive coating in accordance with an embodiment.

In some arrangements, conductive strands 22 may be formed from multiple conductive strands that are bundled together. Each strand in the bundle may have a circular cross-section of the type shown in FIGS. 3 and 4 or may have other suitable cross-section. In the example of FIG. 5, conductive strand 22 is formed from a bundle of non-conductive cores 38 that have each been coated with conductive material 36. In the example of FIG. 6, conductive strand 22 is formed from a bundle of non-conductive cores 38. The entire bundle of non-conductive strands 38 may be coated in conductive material 36 to form conductive strand 22.

The examples of FIGS. 3, 4, 5, and 6 are merely illustrative, however. In general, conductive strands 22 may be formed using other combinations of conductive material 36 and nonconductive material 38 or may include only conductive material 36.

Figure 7:
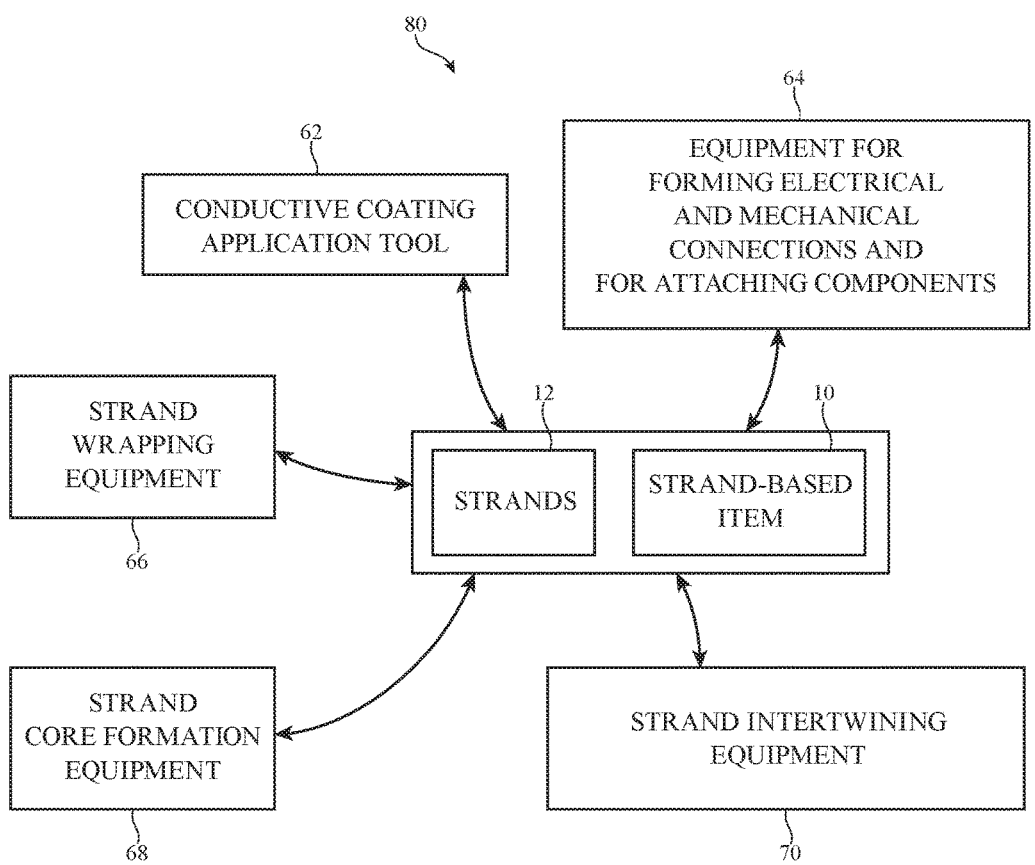
FIG. 7 is a diagram of illustrative equipment of the type that may be used in forming insulated conductive strands and strand-based items that include insulated conductive strands in accordance with an embodiment.

FIG. 7 is a diagram showing different types of equipment 80 that may be used in processing strands 12 (e.g., non-conductive strands 82 and conductive strands 22) and/or that may be used in processing strand-based item 10. As shown in FIG. 7, equipment 80 may include strand core formation equipment 68. Equipment 68 may include, for example, equipment for extruding and/or otherwise forming polymer cores for strands 12. Conductive coating application tool 62 may be used to apply one or more conductive coatings. For example, tool 62 may be used to apply a metal coating such as coating 36 (FIGS. 4, 5, and 6) to a polymer strand core such as core 38 (FIGS. 4, 5, and 6) to form a conductive strand 22. Strand wrapping equipment 66 may be used to wrap strands 12 in additional strands. Equipment 66 may include braiding equipment, twisting equipment, cabling equipment, or other suitable equipment for wrapping strands around strands. As an example, equipment 66 may wrap conductive strands in insulating strands (e.g., fusible insulating strands) to thereby form an insulated conductive strand. Arrangements in which equipment 66 wraps strands in conductive strands may also be used.

Equipment 64 may be used in processing strands 12. Equipment 64 may include a heat source (e.g., a flame, a heated metal structure or other heated structure, a lamp that produces heat, an oven, etc.). Equipment 64 may also include a laser, light-emitting diode, or other light source (e.g., an infrared laser or infrared light-emitting diode, a visible laser or visible light-emitting diode, and/or an ultraviolet laser or light-emitting diode). By applying heat or light or other energy to strands 12 or by using equipment 64 to mechanically or chemically remove material from strands 12, fusible strands (e.g., applied using equipment 66) may be fused, coatings can be selectively removed, liquid polymers and other coating materials may be cured, the texture of strand 12 may be altered, or other strand modifications can be made.

Equipment 64 may be used in attaching electrical components such as electrical components in circuitry 16 of FIG. 1 to strands such as conductive strands 22. For example, equipment 64 may be used to attach electrical components to strands 22 using solder joints, crimped metal connections, welds, conductive adhesive, or other conductive attachment structures. The electrical components that are attached to strands in this way may include light-emitting components, integrated circuits, light-emitting diodes, light-emitting diodes that are packaged with transistor-based circuitry such as communications circuitry and/or light-emitting diode driver circuitry that allows each component to operate as a pixel in a display, discrete components such as resistors, capacitors, and inductors, audio components such as microphones and/or speakers, sensors such as touch sensors (with or without co-located touch sensor processing circuitry), accelerometers, temperature sensors, force sensors, microelectromechanical systems (MEMS) devices, transducers, solenoids, electromagnets, pressure sensors, light-sensors, proximity sensors, buttons, switches, two-terminal devices, three-terminal devices, devices with four or more contacts, etc. Electrical connections for attaching electrical components to strands 12 using equipment 64 may be formed using solder, conductive adhesive, welds, molded package parts, mechanical fasteners, wrapped strand connections, press-fit connections, crimped connections (e.g., bend metal prong connections), and other mechanical connections, portions of liquid coatings (e.g., metallic paint, conductive adhesive, etc.) that are selectively applied to strands 12 using equipment 64, or using any other suitable arrangement for forming an electrical short between conductive structures.

Strand intertwining equipment 70 (e.g., weaving equipment, knitting equipment, braiding equipment, or other strand intertwining equipment) may be used in intertwining strands 12 to form fabric and other structures for strand-based item 10. Equipment 64 may be used to process strands 12 before, during, or after processing of strands 12 with equipment 70 to form item 10.

Figure 8:
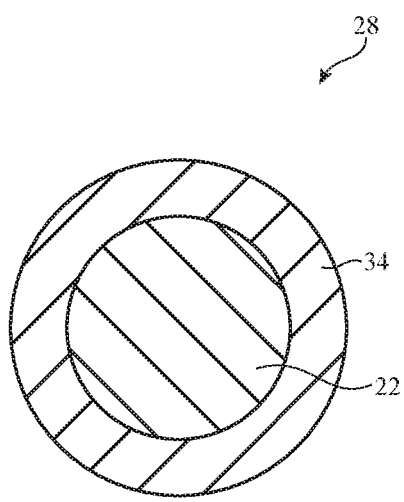
FIG. 8 is a cross-sectional side view of an illustrative insulated conductive strand having a conductive core wrapped in a non-conductive strand in accordance with an embodiment.

To enhance the robustness of conductive strands 22, portions or all of conductive strands 22 may be covered in insulating material. As shown in FIG. 8, conductive strand 22 (e.g., a conductive strand having the configuration of FIG. 3, 4, 5, or 6) may be covered in insulator 34 to form insulated conductive strand 28. In some arrangements, insulator 34 may be an insulating coating formed from one or more dielectric sublayers (e.g., one layer, two layers, three layers, four layers, or more than four layers). To ensure that strand 22 can withstand elevated temperatures, coating 34 may be able to withstand elevated temperatures (e.g., temperatures of 200-300° C., more than 150° C., more than 250° C., more than 350° C., less than 250° C., 210-220° C., or other suitable temperatures). Examples of insulating coating materials that may be used for insulator 34 include polyvinyl formal, polyester-polyimide, polyamide-polyimide, polyamide, polyimide, polyester, polytetrafluoroethylene, and polyurethane (e.g., thermoplastic polyurethane). Other polymers or mixtures of these polymers may be used, if desired. In configurations in which coating layer 34 is formed from multiple sublayers, each sublayer may be formed from the same material or some or all of the sublayers may be formed from different materials.

In some arrangements, insulator 34 may be formed from one or more strands of insulating yarn that has been wrapped (e.g., twisted, braided, cabled, etc.) around conductive strand 22. Examples of materials that may be used to form insulating yarn 34 include polyvinyl formal, polyester-polyimide, polyamide-polyimide, polyamide, polyimide, polyester, polytetrafluoroethylene, polyurethane, and other polymers. If desired, one or more of the yarns that form insulator 34 may be fusible yarn that becomes soft and pliable above a certain temperature and solidifies upon cooling.

Figure 9:
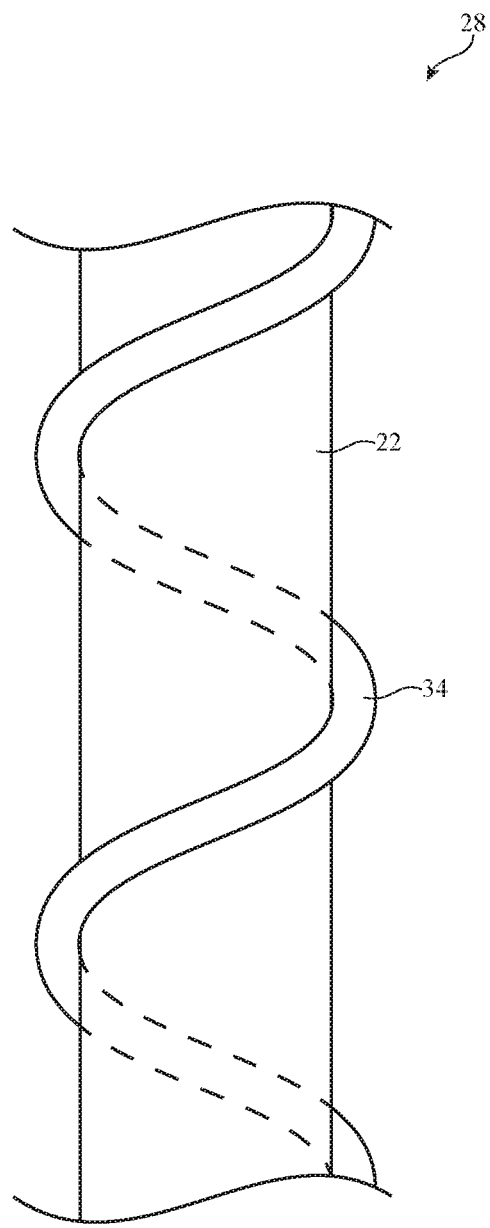
FIG. 9 is a side view of an illustrative conductive strand that is wrapped with a non-conductive strand in a Z-wrap configuration in accordance with an embodiment.
Figure 10:
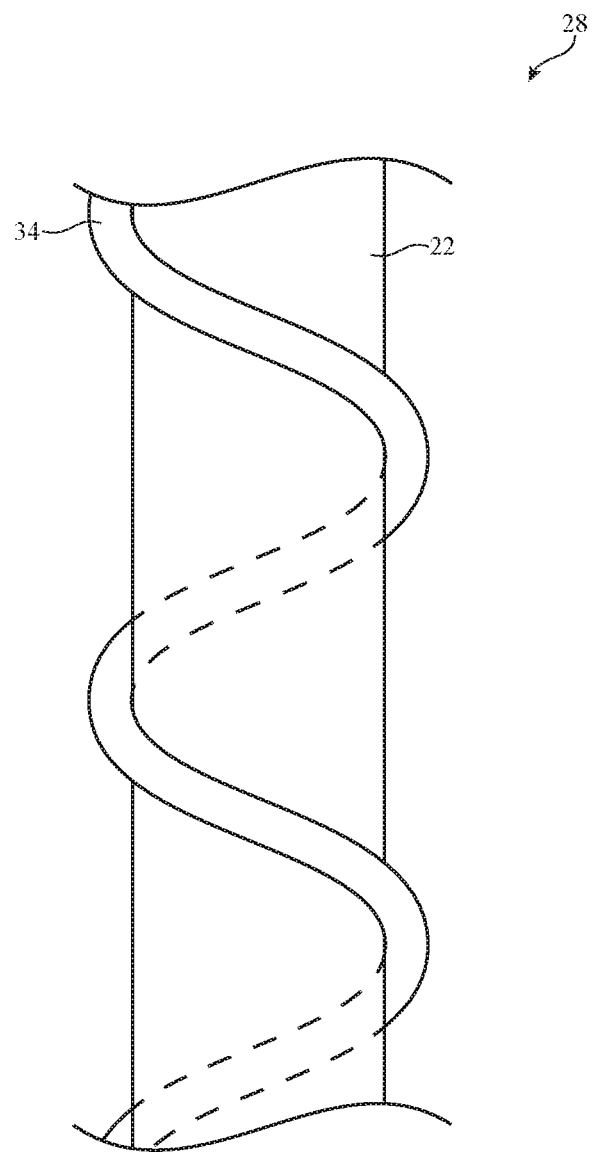
FIG. 10 is a side view of an illustrative conductive strand that is wrapped with a non-conductive strand in an S-wrap configuration in accordance with an embodiment.

Insulating yarns may be wrapped around conductive strand 22 in any suitable fashion. In the example of FIG. 9, insulating yarn 34 has been wrapped around conductive strand 22 in a Z-twist configuration. In the example of FIG. 10, insulating yarn 34 has been wrapped around conductive strand 22 in an S-twist configuration. If desired, one or more insulating yarns 34 may be wrapped around conductive strand 22 in a Z-twist and one or more insulating yarns 34 may be wrapped around conductive strand 22 in an S-twist. Other wrapping arrangements such as braiding or cabling may also be used to cover conductive strand 22 in insulating yarn 34.

Figure 11:
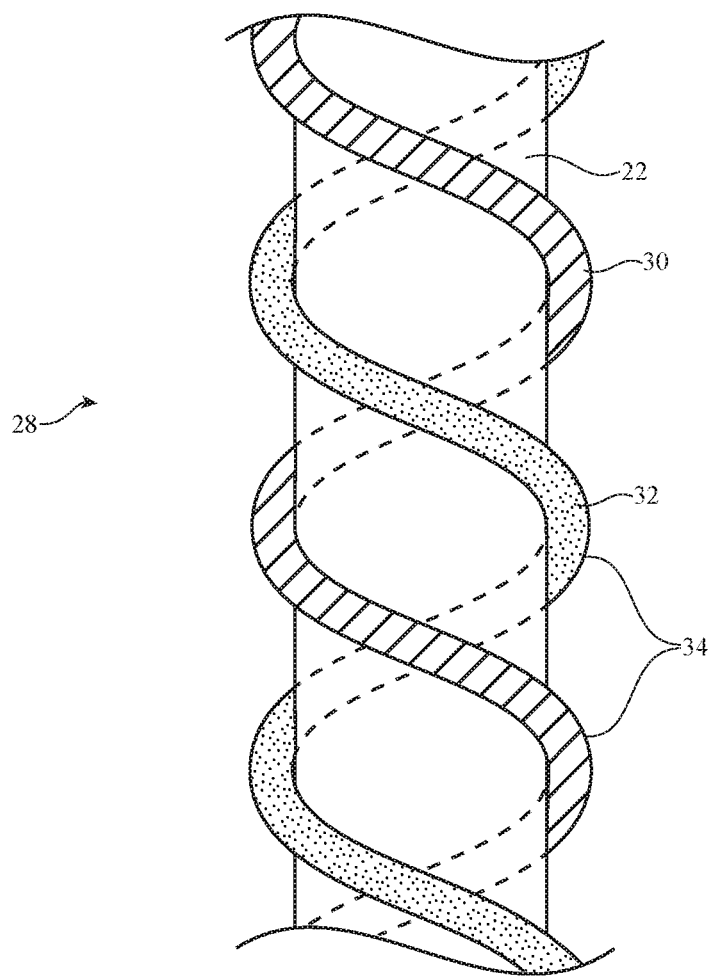
FIG. 11 is a side view of an illustrative conductive strand that is wrapped with non-conductive strands of different materials in accordance with an embodiment.

FIG. 11 shows an example in which insulating yarns of different materials are wrapped around conductive strand 22. Insulating yarns 34 may include insulating yarn 30 and insulating yarn 32. Insulating yarn 32 may be a fusible insulating yarn that becomes soft and pliable above a certain temperature and solidifies upon cooling. Fusible yarn 32 may be formed from a thermosetting polymer material (e.g., thermosetting polyester, polyurethane, polyimide, or other thermosetting resin), thermoplastic material (e.g., thermoplastic polyester, nylon or other suitable polyamide, thermoplastic polyurethane, etc.), or other fusible material that becomes soft when heated to an appropriate temperature (e.g., between 60° C. and 140° C., between 60° C. and 160° C., 80° C. and 100° C., less than 180° C., etc.).

Insulating yarn 30 may be formed from a different material than fusible yarn 32. For example, insulating yarn 30 and fusible yarn 32 may be formed from thermoplastic materials with different melting temperatures. Fusible yarn 32 may have a lower melting temperature than that of insulating yarn 30 so that the application of heat causes fusible yarn 32 to melt and become soft (e.g., while yarn 30 remains solid). In one illustrative example, insulating yarn 30 is formed from nylon and fusible yarn 32 is formed from polyamide, polyester, or other thermoplastic material. When heated to its melting/softening temperature, fusible yarn 32 may soften and spread between insulating yarns 30. Any gaps between insulating yarns 30 may be filled by fusible yarn 32 as it melts. As fusible yarn 32 cools, it solidifies and forms mechanical bonds with yarn 30 to thereby form a watertight covering over conductive strand 22.

Figure 12:
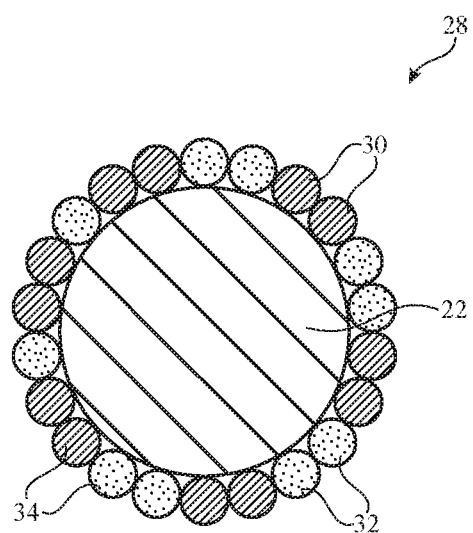
FIG. 12 is a cross-sectional side view of an illustrative conductive strand that is wrapped in fusible insulating strands in accordance with an embodiment.

FIG. 12 is a cross-sectional side view of insulated conductive strand 28 of FIG. 11 prior to fusing fusible yarn 32. As shown in FIG. 12, conductive strand 22 may be wrapped in insulating strands 34. Insulating strands 34 include insulating strands 30 and fusible insulating strands 32. After wrapping conductive strand 22 in insulating strands 30 and 32, heat may be applied using steam, hot air, infra-red rays, a heated element, one or more heated structures, or other heat source to raise the temperature of fusible yarn 32 to its melting temperature (or softening temperature).

Figure 13:
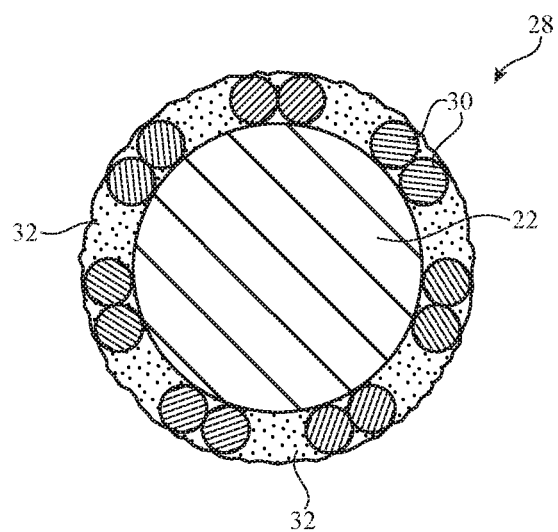
FIG. 13 is a cross-sectional side view of the conductive strand of FIG. 12 in which the fusible insulating strands have been fused to cover the conductive strand in accordance with an embodiment.

When fusible yarn 32 is heated to its melting/softening temperature, it spreads between insulating strands 30. Once cooled, fusible yarn 32 solidifies and forms mechanical bonds with insulating strands 30. As shown in FIG. 13, fusible material 32 fills any gaps between insulating strands 30. The solidified fusible yarn 32 and insulating yarn 30 form a solid, watertight cover over conductive strand 22, providing both electrical insulation and environmental protection for strand 22.

The example of FIG. 13 in which insulator 34 includes insulating strands of different materials is merely illustrative. If desired, insulator 34 may be formed exclusively from fusible yarn 32, may include other fusible materials, may include fusible yarn and one or more non-fusible materials, etc. Arrangements in which insulator 34 is formed from fused strands 32 that are fused between one or more non-fused strands 30 are sometimes described herein as an example. Insulator 34 may be used only on certain portions of a conductive strand 22 or may be used to entirely cover a conductive strand in fabric-based item 10. Insulator 34 may be used to prevent adjacent conductive strands 22 from being shorted together and/or may be used to insulate an electrical connection between an electronic component and conductive strand 22.

Figure 14:
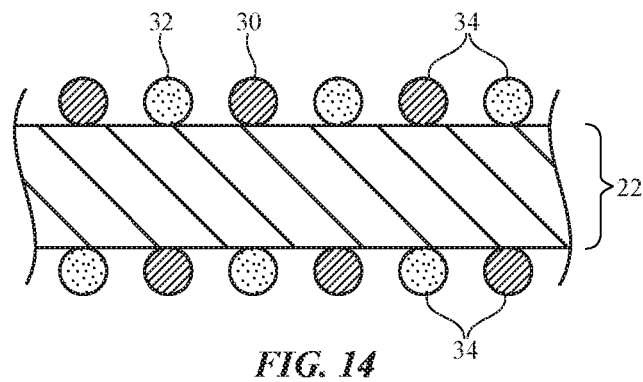
FIG. 14 is a cross-sectional side view of an illustrative conductive strand that is wrapped in fusible insulating strands in accordance with an embodiment.
Figure 15:
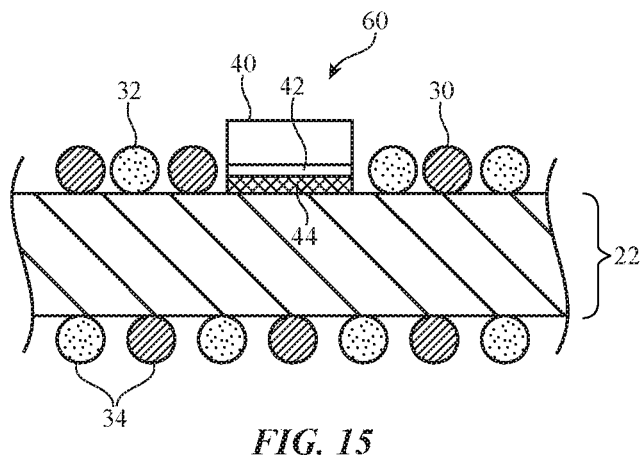
FIG. 15 is a cross-sectional side view of the conductive strand of FIG. 14 in which an electronic component has been mounted to an exposed portion of the conductive strand in accordance with an embodiment.
Figure 16:
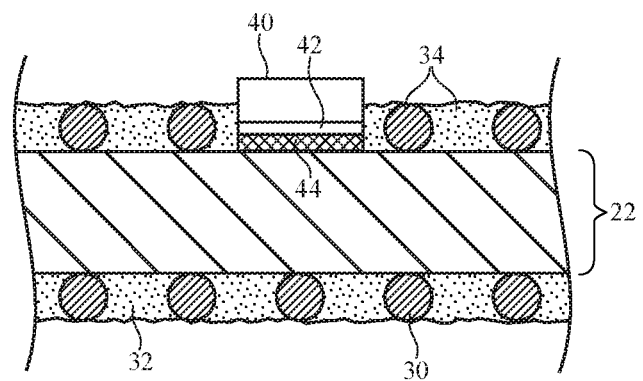
FIG. 16 is a cross-sectional side view of the conductive strand of FIG. 15 in which the fusible insulating strand has been fused around the conductive strand and electronic component in accordance with an embodiment.

FIGS. 14, 15, and 16 show illustrative steps involved in mounting an electronic component to a conductive strand and insulating the electrical connection using fusible strands. As shown in FIG. 14, conductive strand 22 may be wrapped in insulating strands 34. Insulating strands 34 include insulating strands 30 and fusible insulating strands 32. Insulating strands 34 may be wrapped around conductive strand 22 using strand wrapping equipment 66 of FIG. 7 (e.g., braiding equipment, twisting equipment, cabling equipment, or other suitable equipment for wrapping insulating strands 34 around conductive strand 22). Insulating strands 30 and 32 may be wrapped around conductive strand 22 at the same time or may be wrapped around conductive strand 22 in sequential steps.

After wrapping conductive strand 22 in insulating strands 30 and 32, an electronic component such as electronic component 60 may be mounted to conductive strand 22.

Electrical components in item 10 such as illustrative electrical component 60 of FIG. 15 may include discrete electrical components such as resistors, capacitors, and inductors, may include connectors, may include input-output devices such as switches, buttons, light-emitting components such as light-emitting diodes, audio components such as microphones and speakers, vibrators (e.g., piezoelectric actuators that can vibrate), solenoids, electromechanical actuators, motors, and other electromechanical devices, microelectromechanical systems (MEMs) devices, pressure sensors, light detectors, proximity sensors (light-based proximity sensors, capacitive proximity sensors, etc.), force sensors (e.g., piezoelectric force sensors), strain gauges, moisture sensors, temperature sensors, accelerometers, gyroscopes, compasses, magnetic sensors (e.g., Hall effect sensors and magnetoresistance sensors such as giant magnetoresistance sensors), touch sensors, and other sensors, components that form displays, touch sensors arrays (e.g., arrays of capacitive touch sensor electrodes to form a touch sensor that detects touch events in two dimensions), and other input-output devices, electrical components that form control circuitry such as non-volatile and volatile memory, microprocessors, application-specific integrated circuits, system-on-chip devices, baseband processors, wired and wireless communications circuitry, and other integrated circuits. Electrical components such as component 60 may be bare semiconductor dies (e.g., laser dies, light-emitting diode dies, integrated circuits, etc.) or packaged components (e.g. semiconductor dies or other devices packaged within plastic packages, ceramic packages, or other packaging structures).

One or more electrical terminals such as contact pad 42 may be formed on body 40 of component 60. Body 40 may be a semiconductor die (e.g., a laser die, light-emitting diode die, integrated circuit, etc.) or may be a package for a component (e.g., a plastic package or other dielectric package that contains one or more semiconductor dies or other electrical devices). Contacts for body 40 such as pad 42 may be protruding leads, may be planar contacts, may be formed in an array, may be formed on any suitable surfaces of body 40, or may be any other suitable contacts for forming electrical connections to component 60. For example, pad 42 may be a metal solder pad.

Electronic component 60 may be mounted directly to conductive strand 22 or electronic component 60 may be mounted to a support structure (sometimes referred to as an interposer) that is mounted to conductive strand 22. For example, electronic component 60 may be mounted to a printed circuit, ceramic carrier, or other dielectric substrate having contacts that electrically connect electronic component 60 to conductive strand 22.

Conductive material such as conductive material 44 may be used in mounting body 40 to conductive strand 22. Conductive material 44 may be solder (e.g., low temperature or high temperature solder), may be conductive adhesive (isotropic conductive adhesive or anisotropic conductive film), may be formed during welding, or may be other conductive material for coupling electrical device pads (body pads) such as pad 42 on body 40 to conductive strand 22.

In some arrangements, insulating strands 34 may be moved to the side to accommodate electronic component 60. In other words, some or most of conductive strand 22 may be covered in insulating strands 34 but insulating strands 34 may be moved to expose a portion of conductive strand 22. Electronic component 60 may be mounted to the exposed portion of conductive strand 22. In other arrangements, insulating strands 34 need not be moved. For example, solder 44 may be placed on insulating strands 34 but may wick between insulating strands 34 to make contact with conductive strand 22 when solder 44 is heated to its melting temperature.

After mounting electronic component 60 to the exposed portion of conductive strand 22, heat may be applied to raise the temperature of strands 32 to their melting/softening temperature. Once strands 32 reach the appropriate temperature, the fusible material of strands 32 becomes soft and spreads between insulating strands 30. As shown in FIG. 16, melted fusible material 32 fills any gaps between insulating strands 30 and covers exposed portions of conductive material 44. Fusible material 32 is then allowed to cool so that material 32 solidifies and forms bonds with insulating strands 30. Insulating fusible material 32 an insulating strands 30 together form a watertight cover over conductive strand 22 that provides both electrical insulation and environmental protection of conductive strand 22 and the electrical connection between component 60 and conductive strand 22.

The example of FIG. 16 in which fusible strands 32 insulate an electronic component is merely illustrative. If desired, fusible strand 32 may be used to insulate other electrical connections (e.g., electrical connections between two conductive strands 22) and/or may be used to form a watertight covering over portions of fabric-based item 10 to protect portions of fabric-based item 10 from moisture and other contaminants.

Figure 17:
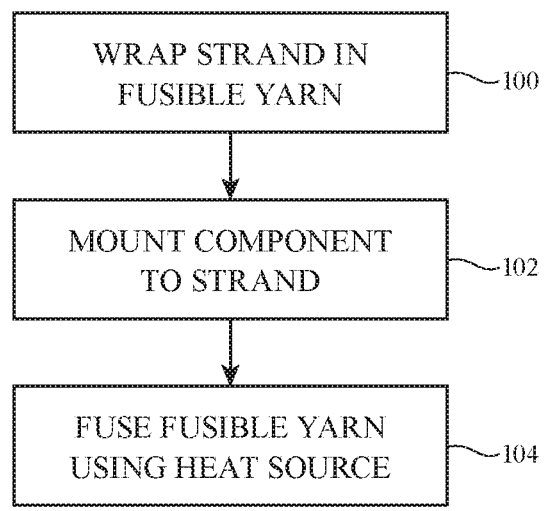
FIG. 17 is a flow chart of illustrative steps involved in mounting an electronic component to a conductive strand that is wrapped in fusible insulating strands in accordance with an embodiment.

FIG. 17 is a flow chart of illustrative steps involved in mounting an electrical component to a conductive strand and insulating the electrical connection with fusible yarn.

At step 100, strand wrapping equipment 66 (FIG. 7) may be used to wrap a conductive strand such as conductive strand 22 of FIG. 3, 4, 5, or 6 in one or more insulating strands. The strand wrapping equipment may twist, braid, cable, or otherwise wrap insulating strands such as fusible strands 32 and insulating strands 30 of FIG. 11 around conductive strand 22.

At step 102, an electronic component such as electronic component 60 of FIG. 15 may be mounted and electrically connected to conductive strand 22. This may include, for example, forming an electrical and mechanical connection between the conductive contacts of the electronic component and the conductive outer surface of conductive strand 22. Solder, conductive adhesive, or other suitable conductive material may be used to electrically and mechanically connect the electronic component to strand 22. In arrangements where solder is used, the solder may wick in between insulating strands 30 and fusible insulating strands 32 to reach conductive strand 22.

At step 104, heat may be applied to raise the temperature of strands 32 to their melting/softening temperature. Once strands 32 reach the appropriate temperature, the fusible material of strands 32 becomes soft and spreads between insulating strands 30 (e.g., as shown in FIGS. 13 and 16). Fusible material 32 is then allowed to cool so that material 32 solidifies and forms bonds with insulating strands 30. Fusible insulating strands 32 an insulating strands 30 together form a watertight cover over conductive strand 22 that provides both electrical insulation and environmental protection of conductive strand 22 and the electrical connection between component 60 and conductive strand 22.

Figure 18:
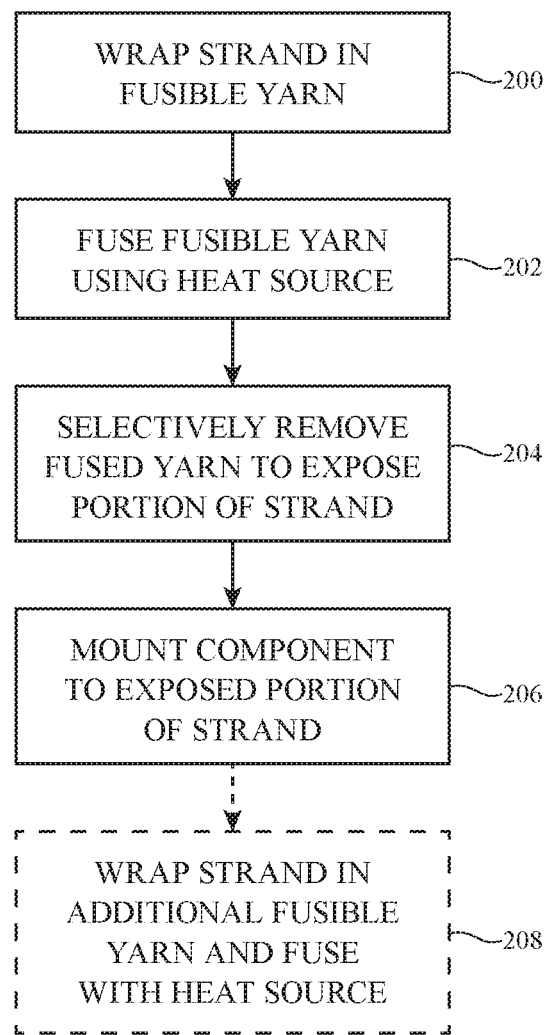
FIG. 18 is a flow chart of illustrative steps involved in mounting an electronic component to a conductive strand that is partially covered with fused insulating strands in accordance with an embodiment.

The example of FIG. 17 in which fusible yarn 32 is fused following attachment of component 60 is merely illustrative. If desired, electrical connections to conductive strand 22 may be formed after yarn 32 is fused. FIG. 18 is a flow chart of illustrative steps involved in mounting an electronic component to a conductive strand after fusible yarn around the conductive strand has been fused.

At step 200, strand wrapping equipment 66 (FIG. 7) may be used to wrap a conductive strand such as conductive strand 22 of FIG. 3, 4, 5, or 6 in one or more insulating strands. The strand wrapping equipment may twist, braid, cable, or otherwise wrap insulating strands such as fusible strands 32 and insulating strands 30 of FIG. 11 around conductive strand 22.

At step 202, heat may be applied to raise the temperature of strands 32 to their melting/softening temperature. Once strands 32 reach the appropriate temperature, the fusible material of strands 32 becomes soft and spreads between insulating strands 30 (e.g., as shown in FIGS. 13 and 16). Fusible material 32 is then allowed to cool so that material 32 solidifies and forms bonds with insulating strands 30.

At step 204, portions of insulator 34 formed from strands 30 and fused strands 32 may be removed to expose a conductive surface of conductive strand 22. Equipment that may be used to selectively remove portions of insulator 34 include laser ablation equipment, chemical removal equipment, selective abrasion equipment, cutting equipment, machining equipment, or other suitable equipment.

At step 206, an electronic component such as electronic component 60 of FIG. 15 may be mounted and electrically connected to the exposed portion of conductive strand 22. This may include, for example, forming an electrical and mechanical connection between the conductive contacts of the electronic component and the conductive outer surface of conductive strand 22. Solder, conductive adhesive, or other suitable conductive material may be used to electrically and mechanically connect the electronic component to strand 22.

At optional step 208, strand wrapping equipment may be used to wrap additional insulating strands (e.g., additional fusible or non-fusible strands) around conductive strand 22. The additional insulating strands may be wrapped around the entire length of strand 22 or may be wrapped around the portion of strand 22 where electronic component 60 is mounted. The additional insulating strands may then be fused by applying heat so that the fusible material melts and spreads around strand 22 and covers the electrical connection between component 60 and strand 22.

The foregoing is merely illustrative and various modifications can be made by those skilled in the art without departing from the scope and spirit of the described embodiments. The foregoing embodiments may be implemented individually or in any combination.

What is claimed is:

1. A fabric-based item, comprising:
   conductive yarns that are intertwined with nonconductive yarns to form fabric, wherein at least one of the conductive yarns comprises:
   a conductive strand that forms a conductive core of the at least one conductive yarn;
   a first insulating strand wrapped around the conductive strand, wherein the first insulating strand comprises polymer; and
   a second insulating strand wrapped around the conductive strand, wherein the second insulating strand comprises fusible material having a lower melting temperature than that of the first insulating strand and wherein the first and second insulating strands form an insulator that covers the conductive core.

2. The fabric-based item defined in claim 1 wherein the second insulating strand comprises thermoplastic polymer material.

3. The fabric-based item defined in claim 1 wherein the second insulating strand is mechanically bonded to the first insulating strand and wherein the insulator formed by the first and second insulating strands comprises a watertight insulator around a first portion of the conductive strand.

4. The fabric-based item defined in claim 3 wherein the watertight insulator has a gap that exposes a second portion of the conductive strand.

5. The fabric-based item defined in claim 4 further comprising:
   an integrated circuit mounted to the second portion of the conductive strand that is exposed by the gap in the watertight insulator.

6. The fabric-based item defined in claim 5 further comprising conductive material that electrically connects the integrated circuit to the conductive strand.

7. The fabric-based item defined in claim 6 wherein the second insulating strand covers at least some of the conductive material.

8. The fabric-based item defined in claim 1 wherein the conductive strand comprises a conductive coating on a non-conductive core.

9. The fabric-based item defined in claim 8 wherein the non-conductive core comprises polymer.

10. The fabric-based item defined in claim 9 wherein the polymer comprises a material selected from the group consisting of: polyamide, aromatic polyamide, polyimide, polyester, polyolefin, acrylic, aromatic polyesters, polyethylene, cellulosic polymer, and polyurethane.

11. The fabric-based item defined in claim 8 wherein the conductive coating comprises a material selected from the group consisting of: gold, silver, copper, aluminum, nickel, palladium, molybdenum, platinum, titanium, and tungsten.

12. An item, comprising:
   strands of material that are intertwined to form fabric, wherein at least one of the strands of material comprises a conductive core and first and second polymer strands that are wrapped around the conductive core; and
   an integrated circuit that is mounted and electrically connected to the conductive core using a conductive material, wherein the first polymer strand comprises fusible material that insulates the conductive core around the integrated circuit, wherein the conductive material has edge portions, and wherein the fusible material covers the edge portions to insulate the conductive material.

13. The item defined in claim 12 wherein the conductive material comprises solder having a first melting temperature, wherein the fusible material of the first polymer strand has a second melting temperature, and wherein the second melting temperature is lower than the first melting temperature.

14. The item defined in claim 12 wherein the fusible material comprises thermoplastic polymer material that has been melted to form a watertight covering over the conductive core.

15. The item defined in claim 12 wherein the second polymer strand is interspersed with and mechanically bonded to the first polymer strand, and wherein the first polymer strand fills gaps between portions of the second polymer strand.

16. An item, comprising:
- a conductive strand;
- a first insulating material wrapped around the conductive strand, wherein the first insulating material has a first melting temperature;
- a second insulating material wrapped around the conductive strand, wherein the second insulating material has a second melting temperature that is lower than the first melting temperature, wherein the first and second insulating materials form a watertight cover around a first portion of the conductive strand; and
- an electronic component electrically connected to a second portion of the conductive strand using solder, wherein the solder is located inside an opening in the second insulating material, wherein the electronic component is interposed between two strand segments of the first insulating material, wherein the electronic component has a periphery, wherein the second insulating material extends around the entire periphery and contacts the electronic component to provide electrical insulation around the electronic component, and wherein the electronic component is selected from the group consisting of: a sensor and a light-emitting diode.

17. The item defined in claim 16 wherein the first insulating material comprises nylon and the second insulating material comprises polyamide.

18. The item defined in claim 16 wherein the first insulating material has additional strand segments that are separated by gaps and wherein the second insulating material fills the gaps.

19. The item defined in claim 16 wherein the conductive strand comprises a polymer core and a metal coating that surrounds the polymer core.

* * * * *